US010433054B1

(12) United States Patent
Smith et al.

(10) Patent No.: US 10,433,054 B1
(45) Date of Patent: Oct. 1, 2019

(54) MEMS DEVICES

(71) Applicant: Cirrus Logic International Semiconductor Ltd., Edinburgh (GB)

(72) Inventors: Ian Johnson Smith, Rosewell (GB); James Thomas Deas, Edinburgh (GB); Vivek Saraf, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/939,994

(22) Filed: Mar. 29, 2018

(51) Int. Cl.
*H03G 11/00* (2006.01)
*H04R 3/00* (2006.01)
*H04R 19/04* (2006.01)
*H04R 29/00* (2006.01)

(52) U.S. Cl.
CPC ............ *H04R 3/007* (2013.01); *H04R 19/04* (2013.01); *H04R 2201/003* (2013.01)

(58) Field of Classification Search
CPC ... H04R 3/007; H04R 19/04; H04R 2201/003
USPC .............................................. 381/55, 58, 56
See application file for complete search history.

(56) References Cited

U.S. PATENT DOCUMENTS

2015/0125003 A1* 5/2015 Wiesbauer ............ B81B 3/0021 381/111
2016/0065058 A1* 3/2016 Van Kampen .......... B81B 7/008 327/536
2016/0150325 A1* 5/2016 Oliaei .................... H04R 1/406 381/111
2017/0150253 A1* 5/2017 Ravnkilde ............. H04R 3/007

* cited by examiner

*Primary Examiner* — Xu Mei
*Assistant Examiner* — Ammar T Hamid
(74) *Attorney, Agent, or Firm* — Jackson Walker L.L.P.

(57) ABSTRACT

The present disclosure relates to a protection system for protecting a MEMS transducer of a MEMS device from electrostatic capture, wherein the MEMS transducer is operable in a normal-sensitivity, mode and in a reduced-sensitivity mode. The protection system comprises: an overload detector for detecting an overload condition arising as a result of an excessive sound pressure level at the MEMS transducer; a signal estimator configured to generate an estimate of a sound pressure level at the MEMS transducer; and a controller configured, in response to detection by the overload detector of an overload condition, to: disable an output of the MEMS transducer; and after a delay of a first predetermined period of time: cause the MEMS transducer to operate in the reduced-sensitivity mode; enable the output of the MEMS transducer; and cause the MEMS transducer to return to the normal-sensitivity mode if the estimate of the sound pressure level generated by the signal estimator while the MEMS transducer is operating in the reduced-sensitivity mode is below a safe sound pressure level threshold for a second predetermined period of time.

19 Claims, 4 Drawing Sheets

MEMS DEVICES

FIELD OF THE INVENTION

The present disclosure relates to the field of MEMS (Micro Electro-Mechanical Systems) devices. In particular, the present disclosure relates to a system and method for protecting a MEMS transducer from electrostatic capture.

BACKGROUND

Micro-electro-mechanical system (MEMS) transducers such as MEMS microphones are increasingly finding application in portable electronic devices such as mobile telephones, laptop and tablet computers, audio and video players, personal digital assistants (PDAs) and wearable devices such as smart watches, at least in part due to the small size of such transducers.

Transducers such as capacitive microphones or pressure sensor devices formed using MEMS fabrication processes typically comprise an electrode that is moveable with respect to a fixed electrode in response to incident acoustic or pressure waves, such that the fixed electrode and the moveable electrode together form a variable capacitance. The moveable electrode may, for example, be supported by a flexible membrane. In use a first one of the electrodes may be biased by a relatively high, stable bias voltage $V_{BIAS}$, which may be of the order of 12V, whilst the other electrode is biased to another fixed voltage $V_{REF}$, typically ground, via a very high impedance, for example, of the order of 10 GΩ. Acoustic or pressure waves incident on the transducer will cause displacement of the moveable electrode with respect to the fixed electrode, thus changing the spacing between these electrodes and hence the inter-electrode capacitance. As the second electrode of the transducer is biased via a very high impedance, these changes in capacitance cause an output signal voltage to appear at an output terminal of the transducer. Given the small capacitance of the MEMS transducer this output signal voltage is relatively small and thus the output signal voltage is typically amplified by a low-noise amplifier (LNA) arrangement.

The spacing between the fixed electrode and the moveable electrode in an equilibrium position (i.e. in the absence of an incident acoustic or pressure wave) is typically of the order of 1-3 μm. Under normal operating conditions the displacement of the moveable electrode towards the fixed electrode in response to incident acoustic or pressure waves may be up to 30% of the average spacing between the fixed electrode and the moveable electrode in its equilibrium position, i.e. if the average spacing between the fixed electrode and the moveable electrode in the equilibrium position is 3 μm then the displacement of the moveable electrode towards the fixed electrode by an incident pressure wave may be up to 1 μm. Thus the spacing, i.e. air gap, between the moveable electrode and the fixed electrode during normal operation of a MEMS transducer may be as small as 2 μm at times.

A problem can arise if the MEMS transducer is subjected to an excessive sound pressure level (SPL) arising from, for example, use in a very loud environment or acoustic shock such as can occur if a device incorporating the transducer is tapped or dropped. In such circumstances the displacement of the moveable electrode may exceed its normal operating range, and the moveable electrode may as a consequence be electrostatically captured by the fixed electrode. In this captured state the sensitivity of the transducer is greatly reduced and audio is not properly captured by the transducer. There is also a risk of permanent mechanical stiction of the moveable electrode to the fixed electrode if the fixed electrode and the moveable electrode do not incorporate design features to mitigate the risk of contact. In the event that the moveable electrode is electrostatically captured by the fixed electrode, it is unable to return to its normal operating state until it is discharged, which typically only occurs after a supply voltage to the moveable electrode is disconnected.

Protection systems exist to protect the LNA arrangement from excessive input voltages that may arise as a result of an event that gives rise to an excessive SPL at the transducer. Such systems typically operate by detecting the event and disabling an input of the LNA arrangement for a predefined period of time. During the predefined period of time the moveable electrode of the MEMS transducer may be discharged, to release it from the fixed electrode if it has been electrostatically captured by the fixed electrode. At the end of the predefined period of time the input of the LNA arrangement is re-enabled and the moveable electrode is re-charged to its normal operating level, thus permitting normal use of the MEMS transducer and LNA arrangement.

One problem with protection systems of the kind described above is that there is no check, prior to re-enabling the input of the LNA arrangement and re-charging the moveable electrode to its normal level, if the SPL at the transducer has returned to a safe level at that time. Thus, it is possible that the input of the LNA arrangement will be re-enabled and the moveable electrode will be re-charged while an excessive SPL is still present at the transducer, leading to the moveable electrode being electrostatically captured again and the attendant risk of permanent stiction, as well as the required inoperative period of the transducer while the moveable electrode is discharged to release it from the fixed electrode and subsequently re-charged.

Accordingly, a need exists for a system that protects a MEMS transducer from electrostatic capture.

SUMMARY

According to a first aspect, the invention provides a protection system for protecting a MEMS transducer of a MEMS device from electrostatic capture, wherein the MEMS transducer is operable in a normal-sensitivity, mode and in a reduced-sensitivity mode, wherein the protection system comprises: an overload detector for detecting an overload condition arising as a result of an excessive sound pressure level at the MEMS transducer; a signal estimator configured to generate an estimate of a sound pressure level at the MEMS transducer; and a controller configured, in response to detection by the overload detector of an overload condition, to: disable an output of the MEMS transducer; and after a delay of a first predetermined period of time: cause the MEMS transducer to operate in the reduced-sensitivity mode; enable the output of the MEMS transducer; and cause the MEMS transducer to return to the normal-sensitivity mode if the estimate of the sound pressure level generated by the signal estimator while the MEMS transducer is operating in the reduced-sensitivity mode is below a safe sound pressure level threshold for a second predetermined period of time.

The MEMS device of the protection system may comprise: a charge pump configured to output a bias voltage to bias the MEMS transducer; an amplifier configured to amplify an analogue electrical signal output by the MEMS transducer in response to a sound or pressure wave incident on the MEMS transducer and to output an amplified analogue electrical signal; and an analogue to digital converter (ADC) configured to convert the amplified analogue signal output by the amplifier into a digital audio output signal, and the charge pump may be operable in a first operating mode in which it outputs a first bias voltage to the MEMS transducer to cause the MEMS transducer to operate in the reduced-sensitivity mode and in a second operating mode in which it outputs a second bias voltage to the MEMS transducer to cause the MEMS transducer to operate in the normal-sensitivity mode.

The overload detector may be configured to compare a DC offset of a signal output by the amplifier to an overload threshold and to output an overload signal to the controller if the DC offset meets or exceeds the overload threshold.

The overload detector may be configured to output an overload signal to the controller on detection of an over-range signal output by the ADC in the event that a magnitude of the analogue electrical signal output by the MEMS transducer exceeds a maximum input signal level of the ADC.

The protection system may further comprise: a MEMS transducer discharge switch activateable selectively to discharge the MEMS transducer, wherein the controller is operative to activate the MEMS transducer discharge switch on detection by the overload detector of an overload condition.

The protection system may further comprise: a charge pump filter; and a charge pump filter bypass switch activateable selectively to bypass the charge pump filter, wherein the controller is operative to activate the charge pump filter bypass switch on detection by the overload detector of an overload condition.

The protection system may further comprise: an output disable switch activateable selectively to disable an output of the MEMS device, wherein the controller is operative to activate the output disable switch on detection by the overload detector of an overload condition.

The controller may be operative to deactivate the output disable switch after a third predetermined period of time if the estimate of the sound pressure level generated by the signal estimator is below the safe sound pressure level threshold for the second predetermined period of time.

The first predetermined period of time may be of the order of 5 ms.

The second predetermined period of time may be of the order of 5 ms.

The third predetermined period of time may be of the order of 10 ms.

The first bias voltage may be of the order of 1 volt.

The second bias voltage may be of the order of 12 volts.

The protection system may further comprise a switch network, wherein the switch network comprises: a charge pump filter bypass switch coupled between first and second terminals of the switch network; a MEMS transducer output disable switch coupled between a third terminal of the switch network and a ground terminal of the switch network; and an output disable switch coupled between fourth and fifth terminals of the switch network, wherein the switch network is coupled to the controller so as to receive control signals from the controller.

The switch network may further comprise a MEMS transducer input discharge switch coupled between a sixth terminal of the switch network and the ground terminal of the switch network.

A second aspect of the invention provides a MEMS device comprising a protection system according to the first aspect.

A third aspect of the invention provides a method for protecting a MEMS transducer of a MEMS audio device from electrostatic capture, the method comprising: operating the MEMS transducer in a normal sensitivity mode of operation; detecting an overload signal indicative of an excessive sound pressure level at the MEMS transducer; in response to detecting the overload signal: disabling an output of the MEMS transducer; and after a delay of a predetermined period of time: re-enabling the output of the MEMS transducer; operating the MEMS transducer in a reduced-sensitivity mode of operation; while operating the MEMS transducer in the reduced-sensitivity mode, estimating a sound pressure level at the MEMS transducer; and if the sound pressure level at the MEMS transducer is below a safe sound pressure level threshold for a second predetermined period of time, returning the MEMS transducer to the normal sensitivity mode of operation.

A fourth aspect of the invention provides a protection system for protecting a MEMS transducer from electrostatic capture, the protection system comprising: a charge pump configured to output a bias voltage to bias the MEMS transducer, wherein the charge pump is configured to operate in a first operating mode in which it outputs a first bias voltage and in a second operating mode in which it outputs a second bias voltage, wherein the second bias voltage is higher than the first bias voltage; a controller configured to control the operating mode of the charge pump; and a signal estimator configured to generate an estimate of a sound pressure level of a sound or pressure wave incident on the MEMS transducer, wherein the controller is operative to cause the charge pump to switch from the first operating mode to the second operating mode if the estimate of the sound pressure level is below a safe sound pressure level threshold.

The controller may be operative to cause the charge pump to switch from the first operating mode to the second operating mode if the estimate of the sound pressure level is below the safe sound pressure level threshold for a first predetermined period of time.

The first predetermined period of time may be of the order of 5 ms.

A fifth aspect of the invention provides an electronic apparatus comprising a MEMS device and a protection system according to the third aspect, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

A sixth aspect of the invention provides an electronic apparatus comprising a MEMS device and a protection system according to the third aspect, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

BRIEF DESCRIPTION OF THE DRAWINGS

Embodiments of the invention will now be described, strictly by way of example only, with reference to the accompanying drawings, of which.

DETAILED DESCRIPTION

Figure 1:
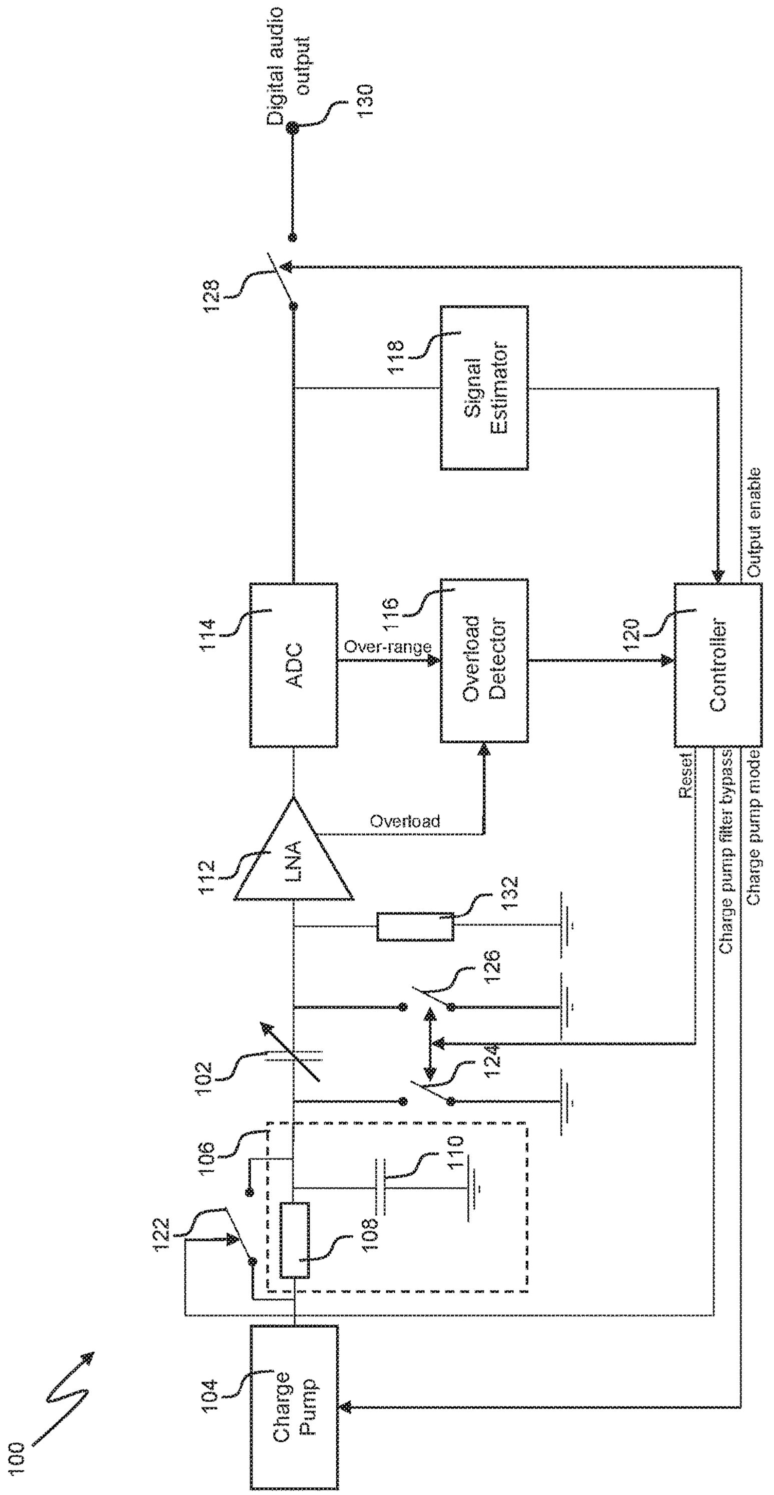
FIG. 1 is a schematic functional block diagram illustrating a MEMS device including a system for protecting a MEMS transducer from electrostatic capture.

Referring first to FIG. 1, an example of a MEMS device, which may be, for example, a MEMS microphone device, is shown generally at 100, and includes a MEMS transducer 102 (represented here as a variable capacitor), a charge pump 104, a charge pump filter 106 made up of a resistor 108 and a capacitor 110, a low noise amplifier (LNA) 112 and an analogue to digital converter (ADC) 114.

The MEMS device 100 also includes elements for implementing a system for protecting the MEMS transducer 102 against electrostatic capture, including an overload detector 116, a signal estimator 118, a controller 120, a charge pump filter bypass switch 122, a MEMS transducer output disable switch 126 and an audio output disable switch 128. In some implementations a MEMS transducer input discharge switch 124 may also be provided. Additionally or alternatively, the charge pump 104 may be controllable to discharge the MEMS transducer 102.

The charge pump 104 is connected to a first, moveable, electrode of the MEMS transducer 102, via the charge pump filter 106, and is configured to supply a bias voltage $V_{BIAS}$ to the first electrode of the MEMS transducer 102.

A second, fixed, electrode of the MEMS transducer 102 is connected to an input of the low noise amplifier (LNA) 112, which is configured to amplify a signal output by the MEMS transducer 102 and output this amplified signal to the ADC 114. A bias resistor 132 having a very high impedance (of the order of 10GΩ or greater) is coupled between the input of the LNA 112 and ground, to bias the LNA input to ground without shorting out an audio band signal output by the MEMS transducer 102. The bias resistor 132 may be implemented using polysilicon diodes, for example.

The ADC 114 is configured to digitise the analogue signal output by the LNA 112 and to output a digital audio output signal to a terminal 130. This digital audio output signal may be processed digitally by downstream components (not illustrated), which may be part of the device 100, or may alternatively be external to the device 100.

The overload detector 116 is configured to detect an overload condition arising as a result of an excessive SPL event at the MEMS transducer 102 and to output a signal to the controller 120 when such an overload condition is detected. To this end, inputs of the overload detector are connected to an output of the LNA 112 and to an over-range output of the ADC 114, and an output of the overload detector 116 is connected to an input of the controller 120.

The signal estimator 118 is configured to estimate the SPL at the MEMS transducer 102, based on the digital signal output by the ADC 114, and to output a signal to the controller 120 when the estimated SPL at the MEMS transducer 102 falls to a safe level. To this end, in the illustrated example an input of the signal estimator 118 is connected to an output of the ADC 114 and an output of the signal estimator 118 is connected to an input of the controller 120. In other examples the signal estimator may be incorporated within the ADC 114.

Figure 3:
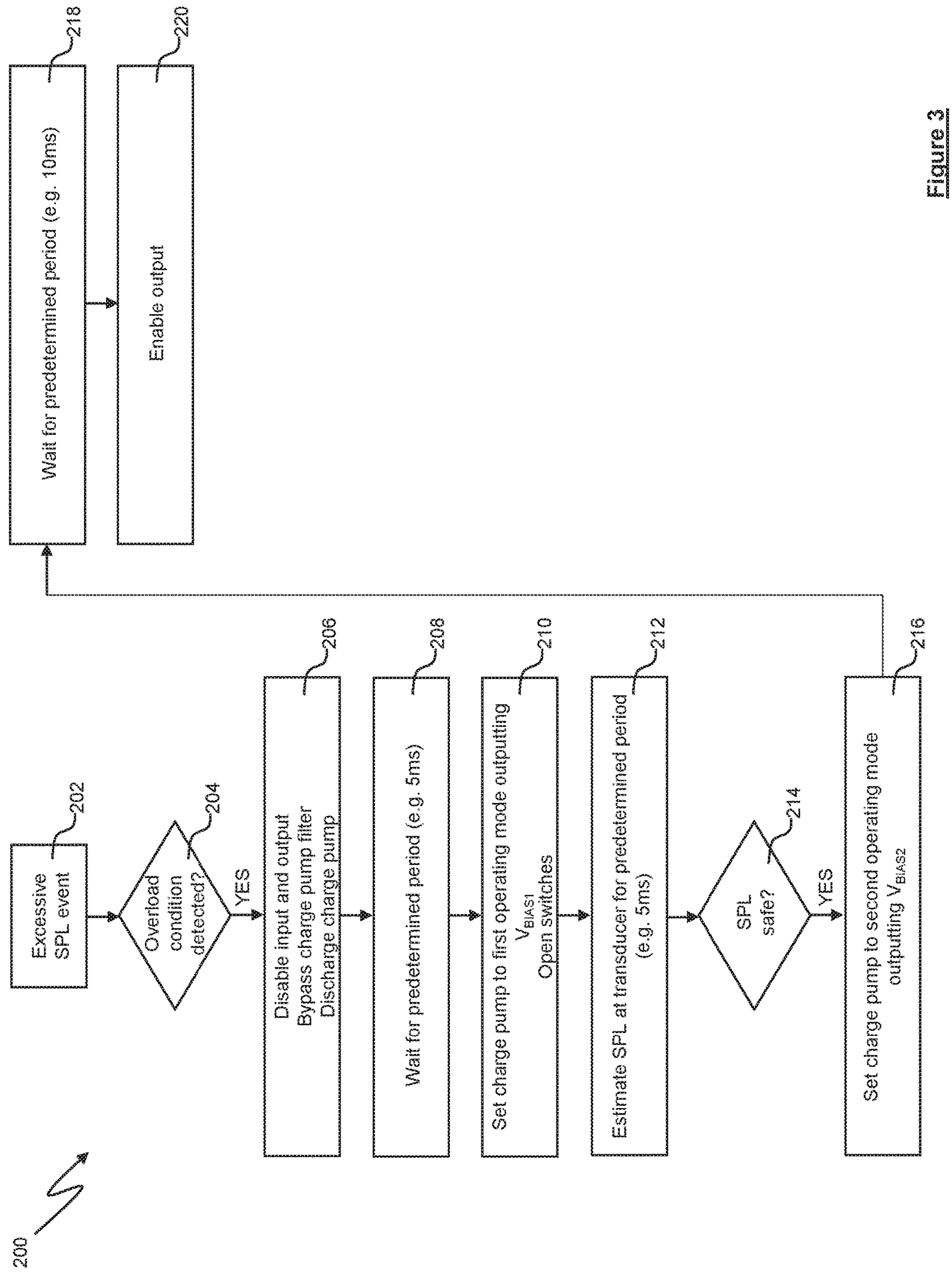
FIG. 3 is a flow diagram illustrating steps performed in a method for protecting a MEMS transducer from electrostatic capture following an excessive SPL event.

The controller 120 is configured to receive the signals output by the overload detector 116 and the signal estimator 118 and to output appropriate control signals to the charge pump 104, charge pump filter bypass switch 122, MEMS transducer input discharge switch 124 (where provided), and MEMS transducer output disable switch 126 in order to protect the MEMS transducer 102 from electrostatic capture, and to output control signals to the audio output disable switch 128, as described below with reference to FIG. 3.

The charge pump filter bypass switch 122 can be activated selectively to bypass the charge pump filter 106 by connecting its input to its output, thereby disabling the charge pump filter 106. The MEMS transducer input discharge switch 124 (where provided) can be selectively activated to connect the first electrode of the MEMS transducer 102 to ground, thereby discharging the first electrode of the MEMS transducer 102. The MEMS transducer output disable switch 126 is selectively activated to connect the second electrode of the MEMS transducer 102 to ground, thereby disabling the output of the MEMS transducer 102, and the audio output disable switch 128 is selectively activated to disconnect the output of the ADC 114 from the terminal 130, thereby effectively opening the signal path and thus disabling the outputting of the digital audio output signal.

In normal operation of the MEMS device 100, the charge pump filter bypass switch 122, MEMS transducer input discharge switch 124 (where provided) and MEMS transducer output disable switch 126 are open and the audio output disable switch 128 is closed. Acoustic or pressure waves are incident on the MEMS transducer 102, which outputs an analogue electrical signal representing the SPL of the incident acoustic or pressure waves to the LNA 112. The LNA 112 outputs an amplified version of this analogue electrical signal to an input of the ADC 114. The ADC 114 is configured to digitise the analogue signal output by the LNA 112 and to output a digital audio output signal to a terminal 130. This digital audio output signal may be processed digitally by downstream components (not illustrated), which may be part of the device 100, or may alternatively be external to the device 100.

The charge pump filter bypass switch 122, MEMS transducer input discharge switch 124 (where provided), MEMS transducer output disable switch 126 and audio output disable switch 128 may be provided as individual switches associated with the charge pump filter 106, MEMS transducer 102 and output terminal 130, as shown in FIG. 1. Alternatively, these switches may be provided as part of a switch network, as will now be described with respect to FIG. 2.

Figure 2:
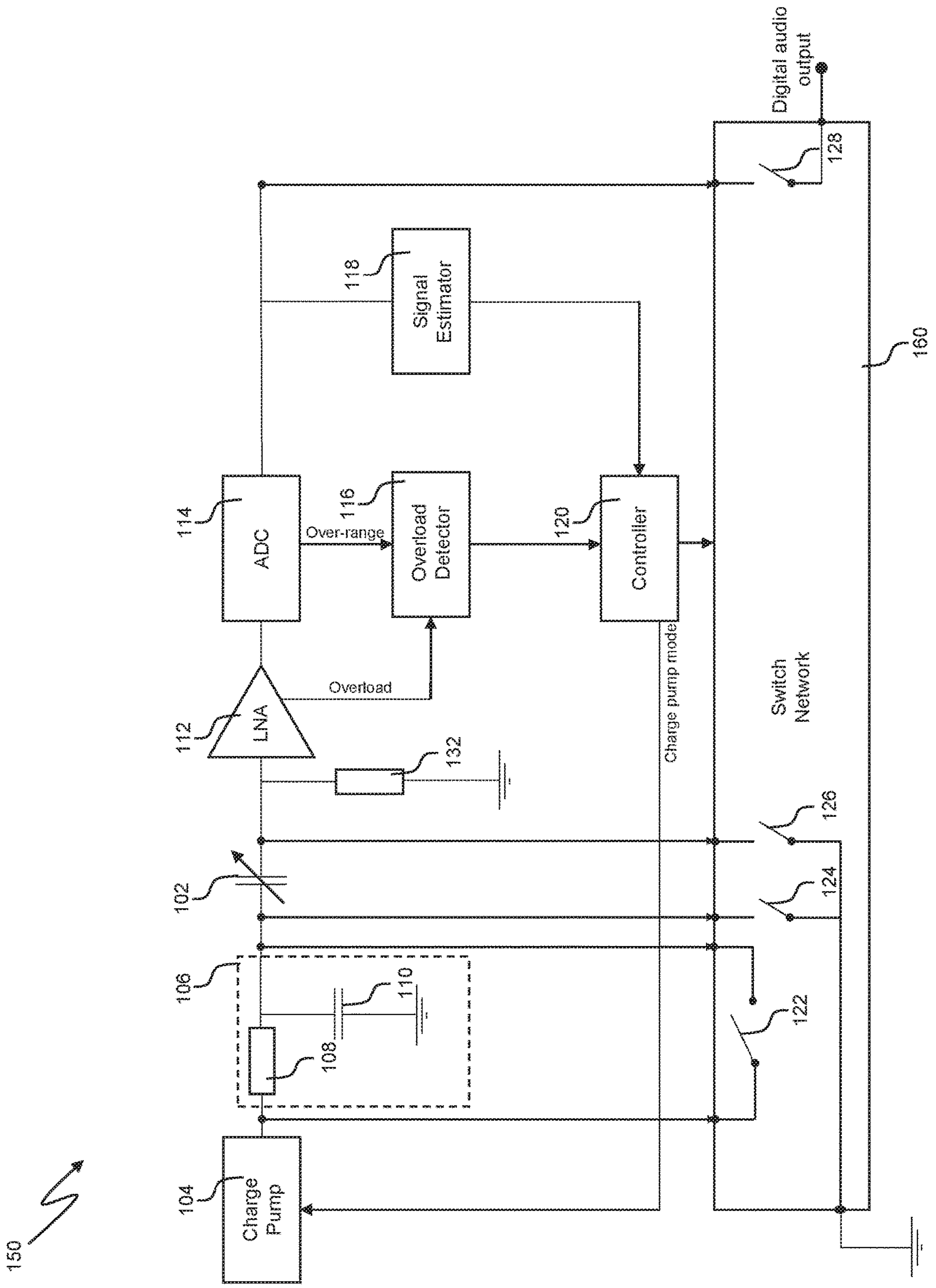
FIG. 2 is a schematic functional block diagram illustrating a MEMS device including a system for protecting a MEMS transducer from electrostatic capture incorporating a switch network.

FIG. 2 is a schematic functional block diagram illustrating a MEMS device including a system for protecting a MEMS transducer from electrostatic capture incorporating a switch network. The MEMS device, shown generally at 150 in FIG. 2, includes many of the elements of the MEMS device 100 of FIG. 1. Those elements that are common to the MEMS device 100 of FIG. 2 and the MEMS device 150 of FIG. 1 are denoted by common reference signs. For reasons of clarity and brevity those common elements will not be described here.

The MEMS device 150 includes a switching network 160 which includes a switches to implement the functionality of the charge pump filter bypass switch 122, MEMS transducer input discharge switch 124, MEMS transducer output disable switch 126 and audio output disable switch 128 of the MEMS device 100 of FIG. 1.

Thus, the switching network 160 includes a charge pump bypass switch 122, coupled between first and second terminals of the switch network 160 that can be coupled to respective input and output nodes of the charge pump filter 106, such that when the charge pump bypass switch 122 is closed the charge pump filter 106 is bypassed.

The switching network may also include a MEMS transducer input discharge switch 124, coupled between a third terminal of the switching network 160 and a ground terminal of the switching network 160. The third terminal of the switching network can be coupled to the first electrode of the MEMS transducer 102, such that when the MEMS transducer input discharge switch 124 is closed the first electrode of the MEMS transducer 102 is coupled to ground to discharge the first electrode of the MEMS transducer 102.

The switching network also includes a MEMS transducer output disable switch 126, coupled between a fourth terminal of the switching network 160 and the ground terminal of the switching network 160. The fourth terminal of the switching network can be coupled to the second electrode of the MEMS transducer 102, such that when the MEMS transducer output disable switch 126 is closed the second electrode of the MEMS transducer 102 is coupled to ground to disable the output of the MEMS transducer 102.

The switching network also includes an audio output disable switch 128, coupled between a fifth terminal of the switching network 160 and sixth terminal of the switching network 160, which is in turn coupled to a digital audio output terminal 130 of the MEMS device 130. The fifth terminal of the switching network can be coupled to the output of the ADC 114, such that when the audio output disable switch 128 is open the output of the ADC 114 is isolated from the digital audio output terminal 130, effectively disabling the digital audio output.

The switch network 160 is coupled to the controller 120 of the MEMS device 150. The controller 120 is operative to receive signals output by the overload detector 116 and the signal estimator 118 and to output appropriate control signals to the charge pump 104 and to the switch network 160 to operate the charge pump bypass switch 122, MEMS transducer input discharge switch 124 (if provided), MEMS transducer output disable switch 126 and audio output disable switch 128 of the switch network as described below with reference to FIG. 3.

FIG. 3 is a flow chart illustrating steps of a method 200 performed by the MEMS device 100 to protect the MEMS transducer 102 from repeated electrostatic capture in the event of an excessive SPL event.

At 202, an excessive SPL event occurs. For example, a device incorporating the MEMS transducer 102 may be dropped or tapped, or else may be placed in an environment where the ambient sound level is very high.

As a result of the excessive SPL event, sound or pressure waves are incident on the moveable first electrode of the MEMS transducer 102 causing displacement of the moveable first electrode towards the fixed second electrode. In some instances the extent of the displacement of the moveable first electrode is such that the moveable first electrode comes into close enough proximity to the fixed second electrode to cause the moveable first electrode to be electrostatically captured by the fixed second electrode of the MEMS transducer 102. The MEMS transducer 102 outputs an analogue electrical signal representing the SPL of the incident sound or pressure waves to the LNA 112, which outputs an amplified version of this electrical signal to an input of the ADC 114 and to the overload detector 116.

The ADC 114 converts this received analogue input signal into a digital output signal. If the magnitude of the received analogue input signal is greater than a maximum predetermined input voltage of the ADC 114 (i.e. is outside the normal operating range of the ADC 114), the ADC 114 may output a signal indicative of this over-range condition at its over-range output.

The overload detector 116 may be configured to detect an overload condition, for example by evaluating a DC offset of the signal output by the LNA 112. If the DC offset of the signal output by the LNA 112 meets or exceeds a predefined overload threshold, an overload condition exists, and the overload detector 116 outputs an overload signal to the controller 120.

The overload detector 116 may additionally or alternatively evaluate a signal received from the over-range output of the ADC 114 to determine whether an overload condition has been detected. If a signal indicative of an over-range condition is present at the over-range output of the ADC 114, an overload condition exists and the overload detector 116 outputs an overload signal to the controller 120.

If an overload condition is detected at step 204 (either by the presence of a DC offset in the output of the LNA 112 that meets or exceeds the predefined overload threshold or by the presence at the over-range output of the ADC 114 of a signal indicative of an over-range condition), then at step 206 the controller 120 issues control signals to the charge pump 104, to the charge pump filter bypass switch 122, to the MEMS transducer input discharge switch 124 (where provided), to the MEMS transducer output disable switch 126 and to the audio output disable switch 128 as follows.

The controller 120 outputs a control signal to the audio output disable switch 128, causing the audio output disable switch 128 to open, thereby isolating the output of the ADC 114 from the terminal 130, effectively disabling the digital audio output such that a digital representation of mute is output at the terminal 130. Alternatively, the audio output disable switch 128 may be left closed, such that an attenuated digital audio signal is allowed to pass to the terminal 130.

The controller 120 outputs a control signal to the MEMS transducer output disable switch 126, causing the MEMS transducer output disable switch 126 to close, connecting the output of the MEMS transducer 102 to ground, thereby effectively disabling the output of the MEMS transducer 102 and protecting the input of the LNA 112 from potentially damaging input voltages.

If the MEMS transducer input discharge switch 124 is provided, the controller 120 outputs a control signal to the MEMS transducer input discharge switch 124, causing the it to close, thereby connecting the first electrode of the MEMS transducer 102 to ground, allowing the first electrode of the MEMS transducer 102 to discharge. Alternative, if no MEMS transducer input discharge switch 124 is provided, a control signal may be output by the controller 120 to the charge pump 104 to cause the charge pump 104 to discharge the first electrode of the MEMS transducer 104. By discharging the first electrode of the MEMS transducer 102, either by means of the MEMS transducer input discharge switch 124 or by means of the charge pump 104, the moveable first electrode can be released from the fixed second electrode if it has been electrostatically captured.

The controller 120 outputs a control signal to the charge pump filter bypass switch 122, causing the charge pump filter bypass switch 122 to close, thereby bypassing the charge pump filter 106. Bypassing the charge pump filter 106 in this way allows the charge pump 104 to discharge.

At step 208, the controller 120 waits for a first predetermined period that is long enough to discharge the charge pump and MEMS, and for the excessive SPL event to cease. For example, the first predetermined period may be 5 ms, or of the order of 5 ms.

Once the first predetermined period has expired, at step 210, the MEMS device 100 begins to operate in a protected mode. The controller 120 outputs a control signal to the charge pump 104, to cause the charge pump 104 to operate in a first mode at which it outputs a first bias voltage $V_{BIAS1}$ to the MEMS transducer 102. The first bias voltage $V_{BIAS1}$ is a relatively low voltage, for example 1 volt. At the same time, the controller 120 outputs control signals to the charge pump filter bypass switch 122, to the MEMS transducer discharge switch 124, and to the MEMS transducer output disable switch 126, to cause those switches to open, thereby enabling the charge pump filter 122 and the output of the MEMS transducer 102, and establishing a signal path from the output of the MEMS transducer 102 to the LNA 112.

In the protected mode the sensitivity of the MEMS transducer 102 is reduced, in comparison to its sensitivity when the MEMS device 100 is not operating in the protected mode, due to the relatively low bias voltage $V_{BIAS1}$. Because of the relatively low bias voltage $V_{BIAS1}$, the charge on the moveable first electrode when the MEMS device 100 is operating in the protected mode is lower than it would be in normal operation of the MEMS device 100. In this condition, the membrane static displacement and the sensitivity are less than they would be in normal operation, and thus there is a reduced likelihood that the moveable first electrode will be electrostatically captured by the fixed second electrode in the event that the excessive SPL event persists.

The MEMS transducer 102 outputs an electrical signal representing the SPL at the MEMS transducer 102 to the LNA 112, which outputs an amplified version of this electrical signal to an input of the ADC 114 and to the overload detector 116.

The signal estimator 118 estimates the SPL at the MEMS transducer 102, based on the signal output by the ADC 114, over a predetermined period of time, which may be, for example, 5 ms or of the order of 5 ms. The signal estimator 118 compares the estimated signal level to a safe SPL threshold to determine whether the SPL at the MEMS transducer 102 is safe, in the sense that it will not cause electrostatic capture of the moveable membrane of the MEMS transducer 102. If the estimated signal level is below the safe SPL threshold for the predetermined period of time, the signal estimator 118 outputs a signal to the controller 120 indicating that the SPL at the MEMS transducer 102 has fallen to a safe level.

In response to this signal, the controller 120 outputs a control signal to the charge pump 104, to cause the charge pump 104 to operate in a second mode at which it outputs a second bias voltage $V_{BIAS2}$ (which is the bias voltage applied to the MEMS transducer 102 in normal operation of the MEMS device 100). The second bias voltage $V_{BIAS2}$ is a relatively high voltage, for example 12 volts. The controller 120 waits for a second predetermined period of time to allow the moveable first electrode of the MEMS transducer 102 to charge to the second bias voltage $V_{BIAS2}$. The second predetermined period of time may be, for example 10 ms or of the order of 10 ms. At the end of the a second predetermined period of time the controller 120 outputs a control signal to the audio output disable switch 128, causing the audio output disable switch 128 to close, thereby reconnecting the MEMS device 100 to the terminal 130 to re-enable the digital audio output. The MEMS device 100 is then able to operate as normal.

Figure 4:
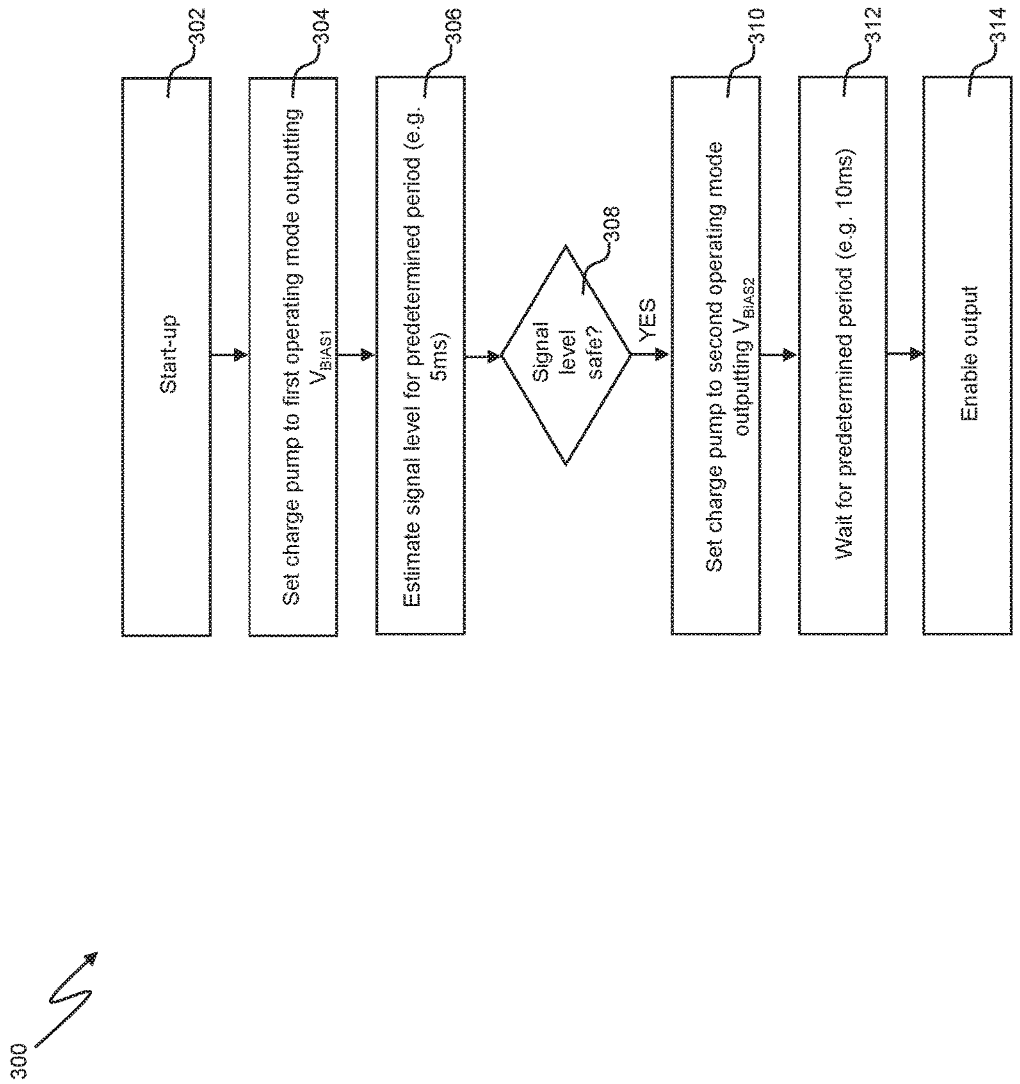
FIG. 4 is a flow diagram illustrating steps performed in a method for protecting a MEMS transducer from electrostatic capture on start-up of a device incorporating the MEMS transducer.

The method described above with respect to FIG. 3 is performed by the MEMS device 100 to protect the MEMS transducer 102 from repeated electrostatic capture in the event of an excessive SPL event, but it will be appreciated by those skilled in the art that the method of FIG. 3 may be adapted to protect the MEMS transducer 102 from electrostatic capture resulting from the presence of an excessive sound pressure level at the MEMS transducer 102 on start-up of the MEMS device 100, as will now be discussed with reference to the flow diagram of FIG. 4.

In the method 300 of FIG. 4, the MEMS device 100 starts up at step 302. At step 304 the controller 120 outputs a control signal to the charge pump 104, to cause the charge pump 104 to operate in its first mode to output the first bias voltage $V_{BIAS1}$ to the MEMS transducer 102. At the same time, the controller 120 outputs control signals to the charge pump filter bypass switch 122, to the MEMS transducer input discharge switch 124 (if provided) and to the MEMS transducer output disable switch 126, to cause those switches to open, thereby enabling the charge pump filter 122 and the output of the MEMS transducer 102, and establishing a signal path from the output of the MEMS transducer 102 to the LNA 112. Thus, on start-up the MEMS device 100 operates in the protected mode described above.

The MEMS transducer 102 outputs an analogue electrical signal representing the SPL of incident sound or pressure waves at the MEMS transducer 102 to the LNA 112, which outputs an amplified version of this analogue electrical signal to an input of the ADC 114 and to the overload detector 116.

At step 306 the signal estimator 118 estimates the sound pressure level at the MEMS transducer 102, based on the signal output by the ADC 114, over the predetermined period of time. At step 308 the signal estimator 118 compares the estimated signal level to the safe sound pressure level threshold to determine whether the sound pressure level at the MEMS transducer 102 is safe, in the sense that it will not cause electrostatic capture of the moveable membrane of the MEMS transducer 102. If the estimated signal level is below the safe sound pressure level threshold for the predetermined period of time, the signal estimator 118 outputs a signal to the controller 120 indicating that the sound pressure level at the MEMS transducer 102 has fallen to a safe level.

In response to this signal the controller 120 outputs (at step 310) a control signal to the charge pump 104, to cause the charge pump 104 to operate in the second mode in which it outputs the second bias voltage $V_{BIAS2}$. The controller 120 waits for the second predetermined period of time (step 312) to allow the moveable first electrode of the MEMS transducer 102 to charge to the second bias voltage $V_{BIAS2}$. At the end of the a second predetermined period of time the controller 120 outputs a control signal to the audio output disable switch 128, causing the audio output disable switch 128 to close, thereby re-enabling the digital audio output (step 314) and permitting normal operation of the MEMS device 100.

As will be appreciated, the system and methods described above provide a mechanism for protecting a MEMS transducer such as a MEMS microphone or pressure sensor transducer from electrostatic capture.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a gaming device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A protection system for protecting a MEMS transducer of a MEMS device from electrostatic capture, wherein the MEMS transducer is operable in a normal-sensitivity, mode and in a reduced-sensitivity mode, wherein the protection system comprises:

an overload detector for detecting an overload condition arising as a result of an excessive sound pressure level at the MEMS transducer;

a signal estimator configured to generate an estimate of a sound pressure level at the MEMS transducer; and a controller configured, in response to detection by the overload detector of an overload condition, to:

disable an output of the MEMS transducer; and after a delay of a first predetermined period of time:

cause the MEMS transducer to operate in the reduced-sensitivity mode;

enable the output of the MEMS transducer; and cause the MEMS transducer to return to the normal-sensitivity mode if the estimate of the sound pressure level generated by the signal estimator while the MEMS transducer is operating in the reduced-sensitivity mode is below a safe sound pressure level threshold for a second predetermined period of time.

2. A protection system according to claim 1 wherein the MEMS device comprises:

a charge pump configured to output a bias voltage to bias the MEMS transducer;

an amplifier configured to amplify an analogue electrical signal output by the MEMS transducer in response to a sound or pressure wave incident on the MEMS transducer and to output an amplified analogue electrical signal; and an analogue to digital converter (ADC) configured to convert the amplified analogue signal output by the amplifier into a digital audio output signal, wherein the charge pump is operable in a first operating mode in which it outputs a first bias voltage to the MEMS transducer to cause the MEMS transducer to operate in the reduced-sensitivity mode and in a second operating mode in which it outputs a second bias voltage to the MEMS transducer to cause the MEMS transducer to operate in the normal-sensitivity mode.

3. A protection system according to claim 2 wherein the overload detector is configured to compare a DC offset of a signal output by the amplifier to an overload threshold and to output an overload signal to the controller if the DC offset meets or exceeds the overload threshold.

4. A protection system according to claim 1 wherein the overload detector is configured to output an overload signal to the controller on detection of an over-range signal output by the ADC in the event that a magnitude of the analogue electrical signal output by the MEMS transducer exceeds a maximum input signal level of the ADC.

5. A protection system according to claim 2 further comprising:

a MEMS transducer discharge switch activateable selectively to discharge the MEMS transducer, wherein the controller is operative to activate the MEMS transducer discharge switch on detection by the overload detector of an overload condition.

6. A protection system according to claim 2 further comprising:

a charge pump filter; and a charge pump filter bypass switch activateable selectively to bypass the charge pump filter, wherein the controller is operative to activate the charge pump filter bypass switch on detection by the overload detector of an overload condition.

7. A protection system according to claim 2 wherein the protection system further comprises:

an output disable switch activateable selectively to disable an output of the MEMS device, wherein the controller is operative to activate the output disable switch on detection by the overload detector of an overload condition.

8. A protection system according to claim 7 wherein the controller is operative to deactivate the output disable switch after a third predetermined period of time if the estimate of the sound pressure level generated by the signal estimator is below the safe sound pressure level threshold for the second predetermined period of time.

9. A protection system according to claim 1 wherein:
the first predetermined period of time is of the order of 5 ms; or
the second predetermined period of time is of the order of 5 ms; or
the third predetermined period of time is of the order of 10 ms.

10. A protection system according to claim 2 wherein the first bias voltage is of the order of 1 volt or wherein the second bias voltage is of the order of 12 volts.

11. A protection system according to claim 1 further comprising a switch network, wherein the switch network comprises:
a charge pump filter bypass switch coupled between first and second terminals of the switch network;
a MEMS transducer output disable switch coupled between a third terminal of the switch network and a ground terminal of the switch network; and
an output disable switch coupled between fourth and fifth terminals of the switch network,
wherein the switch network is coupled to the controller so as to receive control signals from the controller.

12. A protection system according to claim 11 wherein the switch network further comprises a MEMS transducer input discharge switch coupled between a sixth terminal of the switch network and the ground terminal of the switch network.

13. A MEMS device comprising a protection system according to claim 1.

14. A method for protecting a MEMS transducer of a MEMS audio device from electrostatic capture, the method comprising:
operating the MEMS transducer in a normal sensitivity mode of operation;
detecting an overload signal indicative of an excessive sound pressure level at the MEMS transducer;
in response to detecting the overload signal:
disabling an output of the MEMS transducer; and
after a delay of a predetermined period of time:
re-enabling the output of the MEMS transducer;
operating the MEMS transducer in a reduced-sensitivity mode of operation;
while operating the MEMS transducer in the reduced-sensitivity mode, estimating a sound pressure level at the MEMS transducer; and
if the sound pressure level at the MEMS transducer is below a safe sound pressure level threshold for a second predetermined period of time, returning the MEMS transducer to the normal sensitivity mode of operation.

15. A protection system for protecting a MEMS transducer from electrostatic capture, the protection system comprising:
a charge pump configured to output a bias voltage to bias the MEMS transducer, wherein the charge pump is configured to operate in a first operating mode in which it outputs a first bias voltage and in a second operating mode in which it outputs a second bias voltage, wherein the second bias voltage is higher than the first bias voltage;
a controller configured to control the operating mode of the charge pump; and
a signal estimator configured to generate an estimate of a sound pressure level of a sound or pressure wave incident on the MEMS transducer,
wherein the controller is operative to cause the charge pump to operate initially in the first operating mode; and
wherein the controller is operative to cause the charge pump to switch from the first operating mode to the second operating mode if the estimate of the sound pressure level is below a safe sound pressure level threshold.

16. A protection system according to claim 15 wherein the controller is operative to cause the charge pump to switch from the first operating mode to the second operating mode if the estimate of the sound pressure level is below the safe sound pressure level threshold for a first predetermined period of time.

17. A protection system according to claim 16 wherein the first predetermined period of time is of the order of 5 ms.

18. An electronic apparatus comprising a MEMS device and a protection system according to claim 1, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

19. An electronic apparatus comprising a MEMS device and a protection system according to claim 15, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

* * * * *